United States Patent [19]

Ash et al.

[11] Patent Number: 4,891,811
[45] Date of Patent: Jan. 2, 1990

[54] EFFICIENT ADDRESS TEST FOR LARGE MEMORIES

[75] Inventors: Kevin J. Ash; Jack H. Derenburger; Raymond L. Parsons, all of Tucson, Ariz.

[73] Assignee: International Business Machines Corporation, Armonk, N.Y.

[21] Appl. No.: 14,749

[22] Filed: Feb. 13, 1987

[51] Int. Cl.⁴ .......................................... G01R 31/28
[52] U.S. Cl. .................................................. 371/21.2
[58] Field of Search ................ 371/21, 70; 365/201; 364/200 MS File, 900 MS File

[56] References Cited

U.S. PATENT DOCUMENTS

| | | | |
|---|---|---|---|
| 3,727,039 | 4/1973 | Baker | 371/21 |
| 4,061,908 | 12/1977 | de Jonge | 371/21 |
| 4,628,512 | 12/1986 | Loo | 371/21 X |
| 4,757,503 | 7/1988 | Hayes | 371/21 |
| 4,760,575 | 7/1988 | Watanabe | 371/21 |

Primary Examiner—Jerry Smith
Assistant Examiner—Robert W. Beausoliel
Attorney, Agent, or Firm—George E. Clark

[57] ABSTRACT

A memory may contain a large number of bytes of data perhaps as many as 256 megabytes in a typical large memory structure. An error correcting code algorithm may be used to identify failing memory modules in a memory system. In a particular embodiment, a number of spares may be provided on each memory card allowing a predetermined number of defective array modules to be replaced in a storage work. With double bit correction provided by the error correcting code logic, a number of bits can be corrected on a card or a larger number of bits can be corrected on a card pair, where the larger number of bits is somewhat less than double the number of bits which can be corrected on a single card. The address test in accordance with the present invention then produces a pattern that will create a difference greater than that larger number of bits between the data stored in a storage location under test and any address that could be accesseed by an address line failure. The method according to the present invention predicts the effect of an address line failure external to the array modules and internal to a card pair and then tests to see if a failure has occurred. The address test does not declare an address failure until a predetermined number of bit failures on a card is found. The test is valid for single and multiple address line failures. Since only one address bit is changed for each path through the test other failing address lines will not be detected until the path with those failing address bits are tested. Thus, even with multiple address line failure the two addresses that are stored to and fetched from are the only one address bit apart.

4 Claims, 7 Drawing Sheets

FIG.4.5

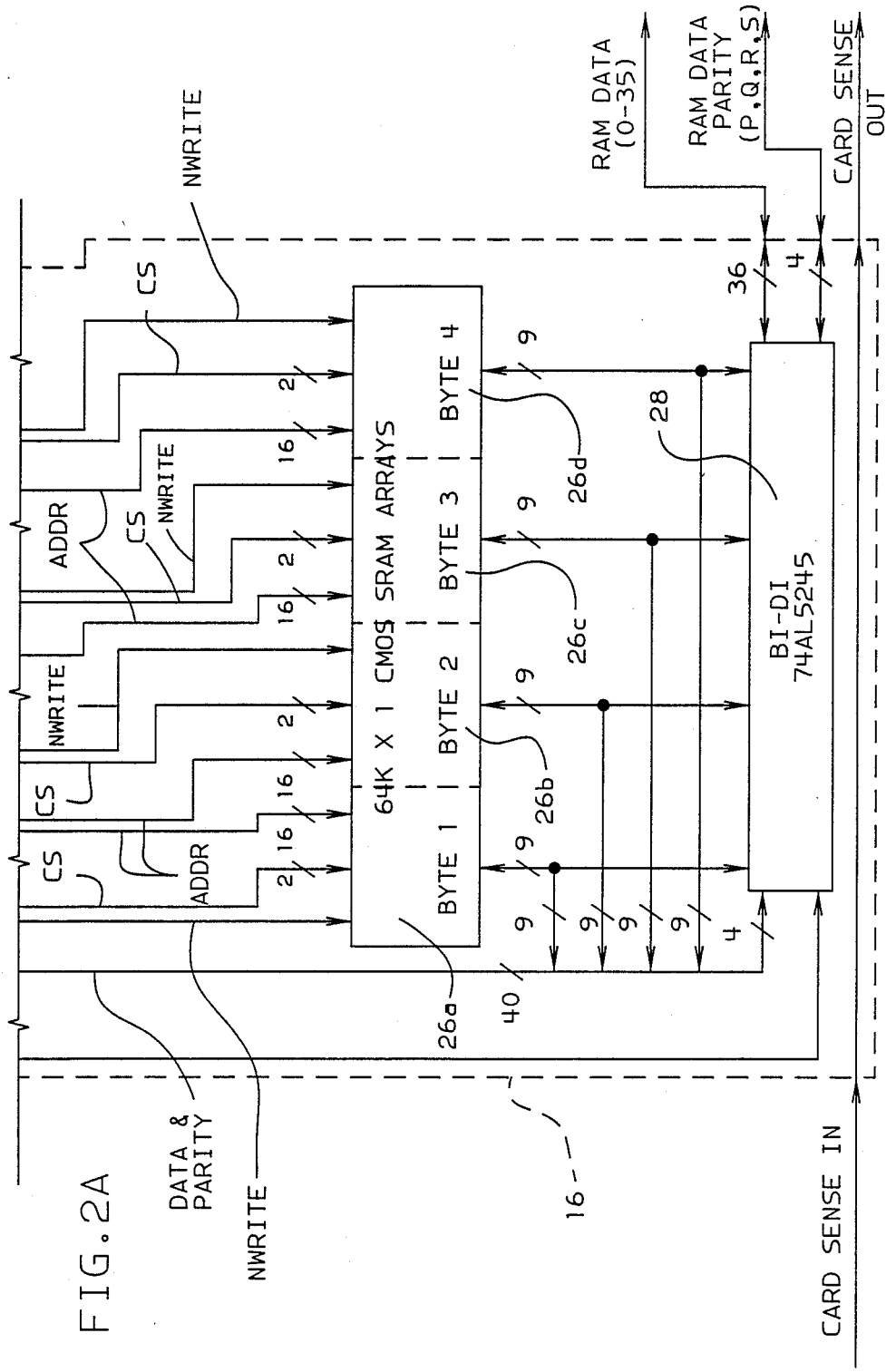

FIG.4.1
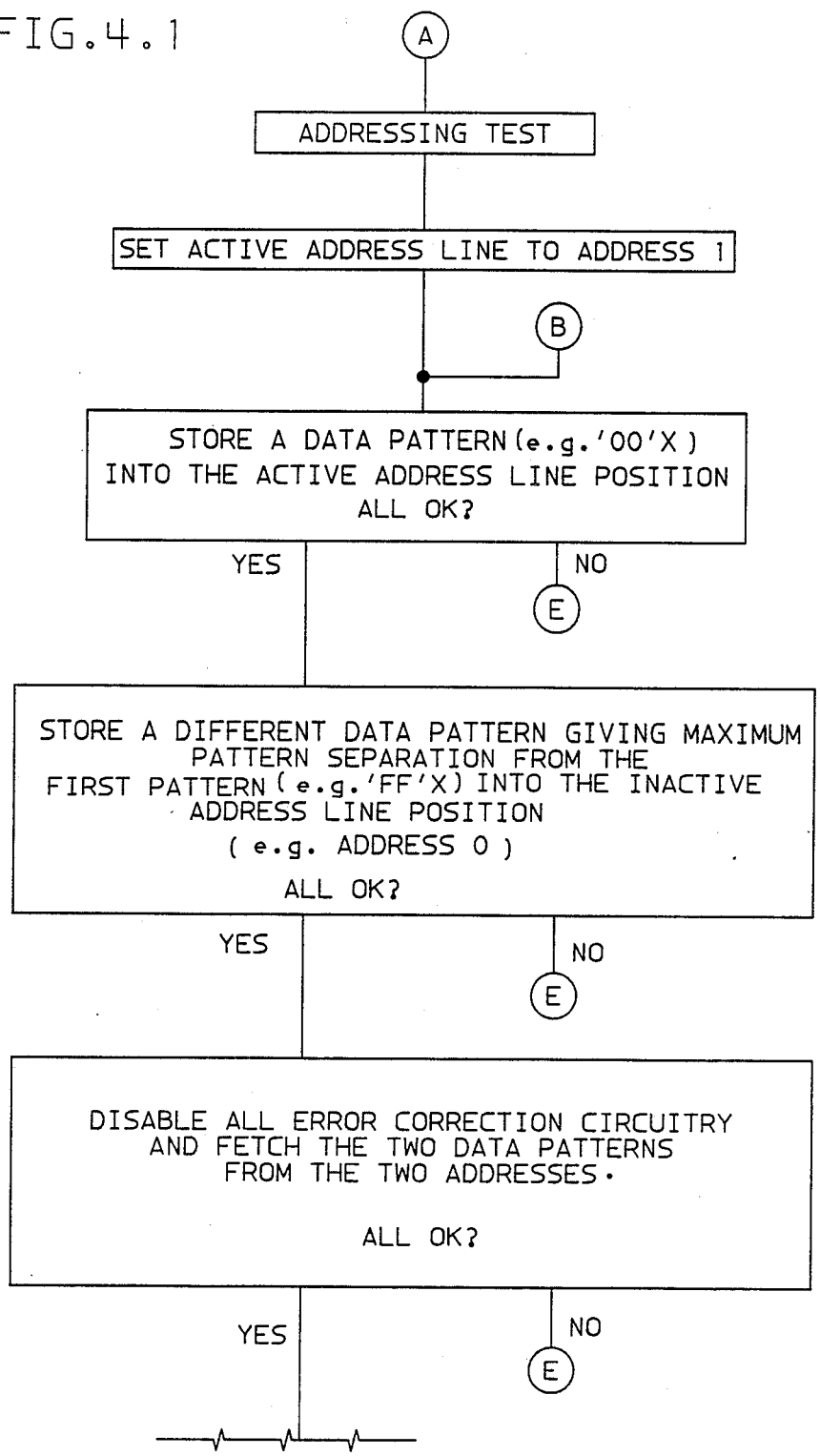

FIG.4.2

```
COMPARE EACH DATA BIT FROM EACH ADDRESS
     TO THE EXPECTED DATA PATTERNS
```

```
WERE THERE MORE DATA BITS IN ERROR
  IN EITHER ADDRESS THAN COULD BE
         CORRECTED TO AVOID
        AN UNCORRECTABLE ERROR?
```

YES → (F)

NO ↓

ALL ADDRESS LINES CHECKED ?

YES → (C)

NO ↓

```
INCREMENT TO NEXT ACTIVE ADDRESS LINE
( e.g.  01 ⟶ 02,  02 ⟶ 04
        04 ⟶ 08,  08 ⟶ 10 ETC )
```

(B)

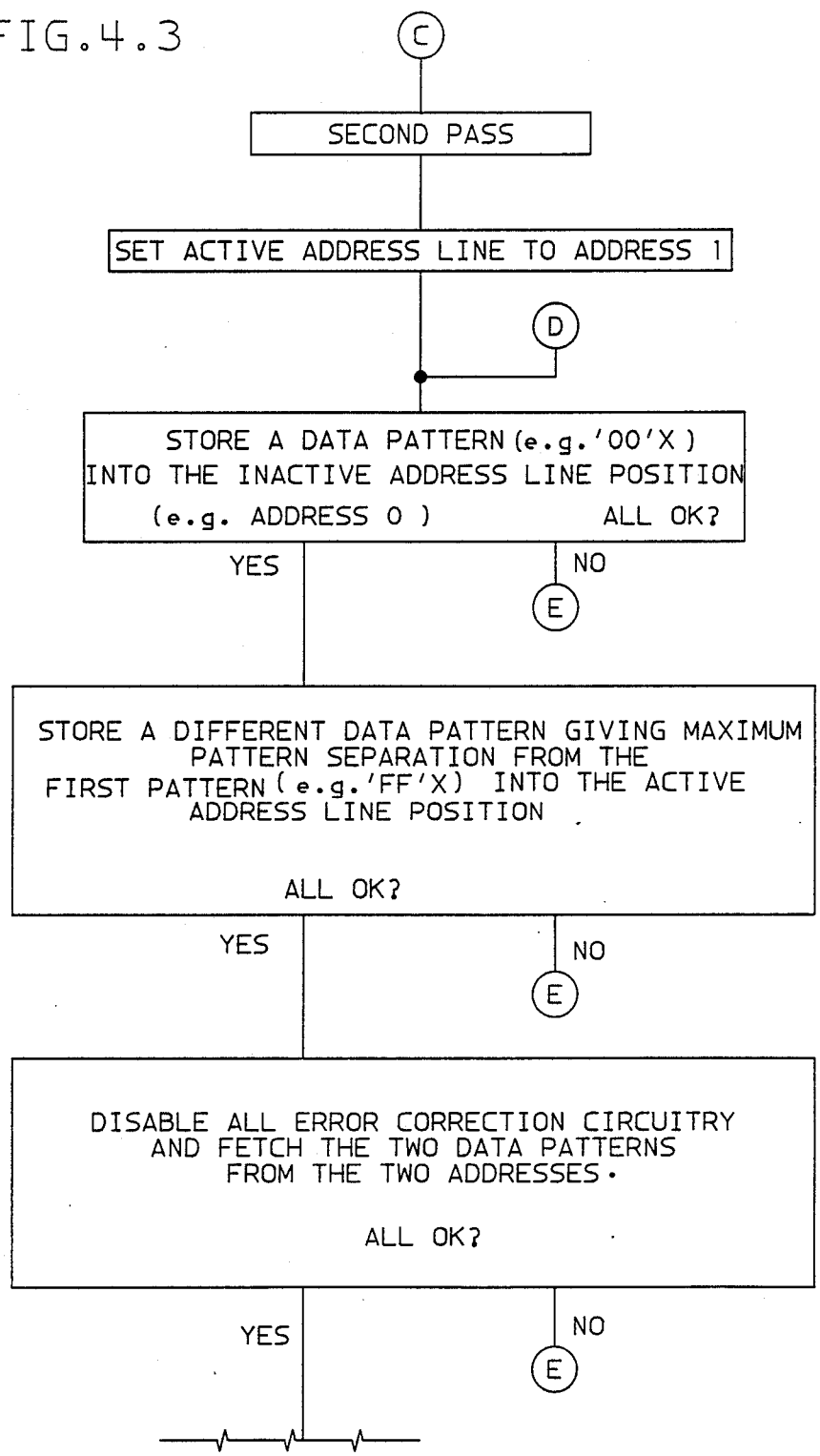
FIG.4.3

FIG.4.4

```
COMPARE EACH DATA BIT FROM EACH ADDRESS
    TO THE EXPECTED DATA PATTERNS
```

```
WERE THERE MORE DATA BITS IN ERROR
   IN EITHER ADDRESS THAN COULD BE
           CORRECTED TO AVOID
        AN UNCORRECTABLE ERROR?
```

YES → (F)

NO ↓

ALL ADDRESS LINES CHECKED ?

YES → (G)

NO ↓

```
INCREMENT TO NEXT ACTIVE ADDRESS LINE
   (e.g. 01 ⟶ 02, 02 ⟶ 04
         04 ⟶ 08, 08 ⟶ 10 ETC)
```

(D)

EFFICIENT ADDRESS TEST FOR LARGE MEMORIES

BACKGROUND OF THE INVENTION

1. Field of the Invention

The present invention relates to information handling systems and more particularly to methods for testing address line failures in a storage system of an information handling system.

2. Prior Art

U.S. Pat. No. 4,369,511 describes a semi-conductor memory test system which reads a memory under test at an address generated by a pattern generator and compares data read from the address with expected data. A block mask memory is read by a portion of the address and the comparing operation of the comparator is inhibited by block mask data read from the block mask memory.

The method for memory testing according to the patent is significantly different from the present invention in that the patent requires a comparison of data read from a memory with data generated and fed through a test memory 22 and compared in comparator 19.

In the method according to the present invention, data is stored in address locations being one bit different and the data is read from the two locations and compared. There is no second memory used to generate an expected storage pattern as in the prior art.

U.S. Pat. No 4,404,519 provides method and apparatus for testing data stored in a memory array embedded in a large scale integrated circuit. The method and apparatus of the patent do not describe or suggest the method for testing address lines in accordance with the present invention.

U.S. Pat. No. 4,429,389 teaches a test pattern address generator which generates specialized address patterns in which an address generator is complimented and then incremented on a series of increment-compliment actions so that all combinations of row and column drivers in the integrated circuit memory under test are exercised.

The patent does not contemplate the method of testing address lines in accordance with the present invention where each address line bit is separately tested by a two-pass test in which divergent data is stored into the address under test and the address into which data would be stored if there was an address line failure for the address bit under test.

U.S. Pat. No. 4,559,626 teaches a test apparatus for testing memories which includes an internal memory into which data patterns are stored for comparison with data patterns stored in a memory under test. The patterns are then read from the internal memory of the tester and the memory under test and compared.

The patent does not contemplate the method of testing address lines in accordance with the present invention where each address line bit is separately tested by a two-pass test in which divergent data is stored into the address under test and the address into which data would be stored if there was an address line failure for the address bit under test.

SUMMARY OF INVENTION

Accordingly, it is an object of the present invention to test address lines in a memory system of an information handling system by a simple and efficient method which provides unique failure information for any address bit failure in the memory system.

It is another object of the present invention to test address lines in a memory system as above in which the method includes writing a first bit pattern into a memory word at an address formed with a bit under test ON where the first bit pattern may be a simple pattern such as all zeros or all ones; writing a divergent bit pattern such as all ones or all zeros respectively into another memory word at an address formed with the bit under test OFF; reading the data from both of the addresses and comparing for a predetermined number of bit errors which indicate a permanent error condition at that address line; repeating these steps for each bit in the address until all the address lines have been tested; then writing the first pattern to the second memory word at the address formed with the bit under test OFF and writing the second pattern to the first memory word at the address formed with the bit under test ON and again reading and comparing to determine if there is a permanent error and again repeating each of the steps for each bit in the address under test until all the address lines have been tested for each card in the memory system.

BRIEF DESCRIPTION OF THE DRAWING

FIG. 2 and FIG. 2A comprise a logic block diagram of the data flow including address information of a memory card which may be tested by the method according to the present invention.

FIGS. 4.1, 4.2, 4.3, 4.4, and 4.5 comprise a flow diagram of a preferred embodiment of a method according to the present invention.

DETAILED DESCRIPTION OF A PREFERRED EMBODIMENT OF THE INVENTION

Figure 1:
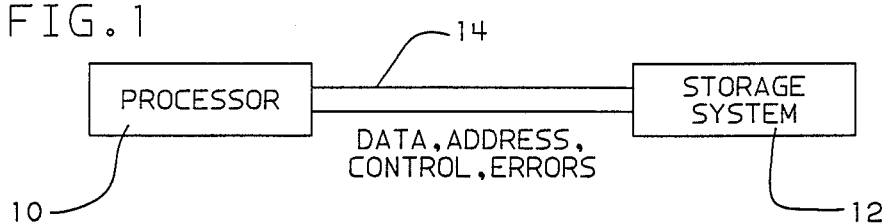
FIG. 1 is a simplified block diagram of a system including a memory which could support the test method according to the present invention.

In information handling systems including processors and memory systems as shown in FIG. 1, there is a need to adequately test the address lines in the memory system to ensure that the addressing of the memory arrays is correct. FIG. 1 is a simple block diagram that shows processor 10 which is connected to storage system 12 by data, address, error and control lines 14.

It should be understood that the processor 10 and storage system 12 may be implemented in many ways by systems that are currently available from many hardware suppliers suchy as IBM Corporation. For example, the processor could be an IBM system 370 processor with its own internal storage system, or an IBM 3880 Model 23 with cache storage system 12.

In the prior art memory address test methods, unique data such as an incrementing pattern or the address is stored in each memory location starting at the lowest address and ending with the highest address. Each location is then read and compared to ensure that the location has not been overlayed by a write to any other location. The same pattern (or the inverse) is then written starting at the highest address and descending to the lowest. The data is again read and compared to ensure that the data has not been over written by a write to any other location. Failures of address lines are detected either by a parity check or by a comparison of a data pattern read from the array not matching the expected data pattern. This method for testing for address line failures will also detect a large portion of data failures in an array. Several of the prior art patents identified above use this kind of memory testing.

With the type of testing as described above, the time required to test a large memory (such as 256 megabytes) is very prohibitive. For example, the projected time required to test a 256 megabyte storage system will be 1 hour 48 minutes and 32 seconds. The method of the present invention is to remove as much dependency on the data as possible when testing the address lines. This is accomplished by comparing the minimum number of data bits affected by any address line failure to the error correction and sparing capability of the memory system under test. The first must be equal to or larger than the second. When the data is fetched and compared to that which is expected, address line failure is indicated only when the number of data bit areas exceeds the correction and sparing capability of the memory system. With this method, the testing of the address lines can be accomplished in as little as one second. Upon successful completion of the addressing test, a separate data test must be performed. This data test can be run concurrent with normal system operation.

Figure 2:
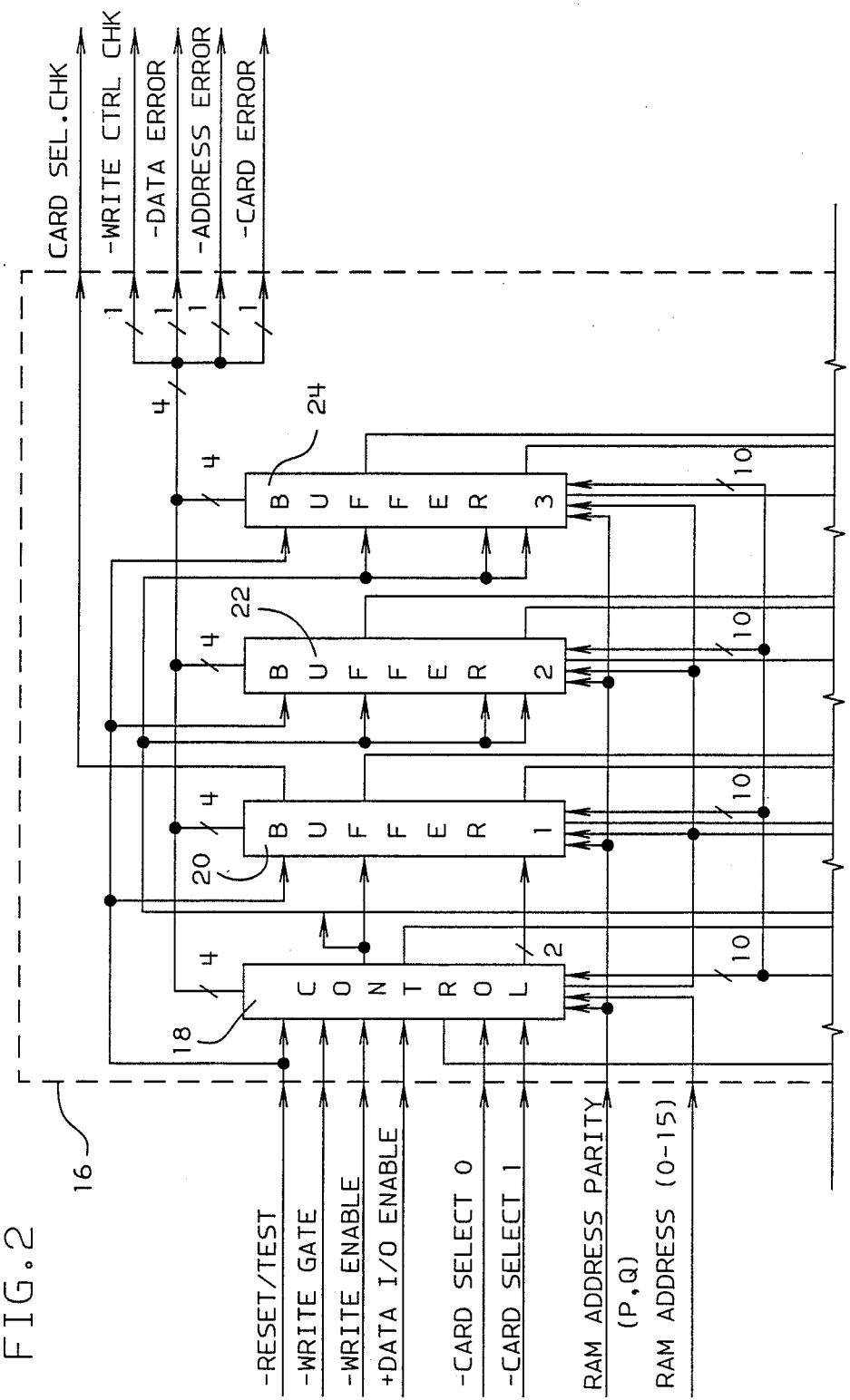

Referring now to FIG. 2, a typical memory card 16 will be described in which the address lines between the buffers 20, 22, and 24 and the memory arrays 26 a, b, c, and d, are tested. Card 16 also includes a set of bi-directional drivers 28 for handling the transmission of data on and off the card. Control lines are connected as inputs to control block 18 which controls the read, write, enable, test, card select and addressing of the arrays 26 a, b, c, d inclusive on card 16.

The discussion above with respect to the hardware environment, specifically the description with respect to FIGS. 1 and 2 is for the purpose of indicating a typical system in which the method according to the present invention might be efficiently employed.

Figure 3:
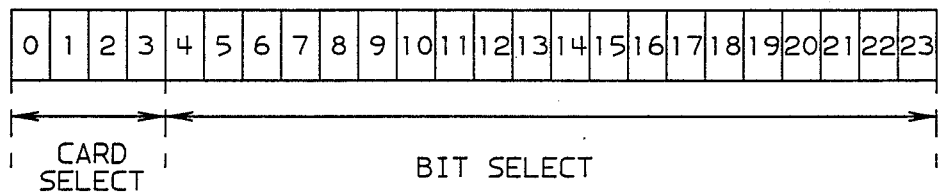
FIG. 3 is a schematic diagram of an address bus structure which could be used with a preferred embodiment of the present invention.
Figure 3:
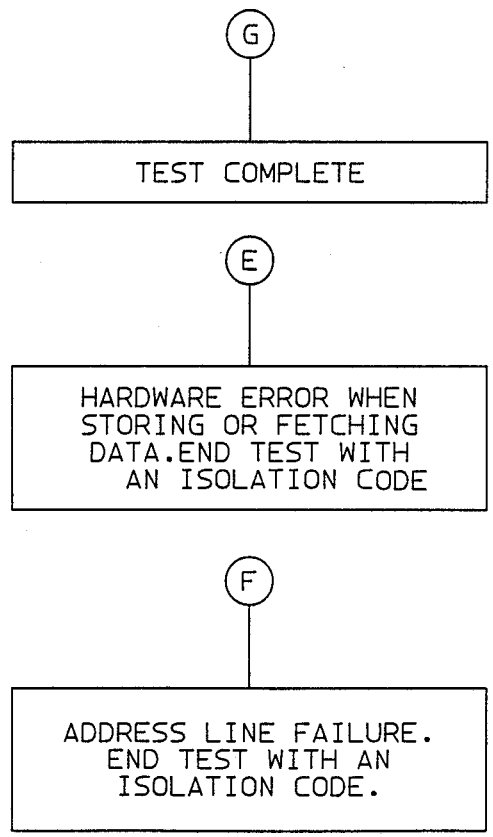

FIG. 3 shows a typical address bus structure for a large memory sub-system might include 24 bits wherein 20 bits address locations unique to each card and 4 bits provide card select. Thus, there would be a possibility of 16 cards each card having one million addressable locations. According to the preferred embodiment of the invention, addresses to be tested are formed by having one specific address bit sent to a "1" and the other nineteen address bits sent to a "0".

The address bus structure of FIG. 3 is shown merely for illustration of a typical addressing scheme for a large scale memory and is not intended to in any way limit the application of the present invention.

The method of the present invention is to be described more fully with respect to a preferred embodiment thereof which is shown in the flow chart of FIG. 4.

When an address line test is to be performed, an appropriate request is sent to the memory control processor 10 in the memory subsystem. The control processor 10 then begins the address test by setting a first bit in the address to a one as the active address line and all other bits in the address are sent to a "0". A first data pattern such as an all zeros data pattern is then stored into that active address line position.

At each step of the process, normal hardware error checks such as parity are being performed to ensure that other failures unrelated to the address test do not occur which could mask the address test being performed.

Next, a different data pattern having a maximum pattern separation from the first pattern is stored into the inactive address line position for the address bit under test.

For example, an all ones pattern might be stored into address zero where the active address line position and the bit under test is the low order bit of the address.

With reference to FIG. 3, the structure of the address on the address bus, the low order address bit position would be identified as bit 23. Thus, with bit 23 on, and all other address bits off or "0" the active address line position would be address 1 and the inactive address line position would be address 0 since only those two addresses which would be affected by a change in the value of address bit 23, the low order bit of the address, all other address bits being zero since the test is conducted one address line at a time to determine whether address line errors are occurring which would result in an expected address bit being a one actually resulting in writing to the address having the subject bit equal to a zero. After the test has been completed for bit 23 of the address, the test is then repeated for each bit of the address 22 through bit 4 for the twenty line bit address of the preferred embodiment of the present invention. Again as before, the normal hardware error correction is performed. At any step in this process if there is an error indicated from the hardware error checking the test ends with an isolation code indicating the cause of the error is generated. It is further understood that the integrity of the address line test according to the present invention, depends upon the integrity of the memory which is being addressed by the address lines such that an error can be identified as related to an address line failure rather than a memroy cell failure.

Next, all error correction circuitry is disabled in the memory system and the data stored into the active and inactive address line positions are then read and compared to the expected values. The data are compared bit by bit and the total number of data bits in error is determined.

A predetermined number of acceptable data bit errors is set that the system can detect and correct. If the number of data bits in any particular compare exceeds that number, an address line failure is indicated and the test is ended with an appropriate error code. In a preferred embodiment of the present invention, six errors per card may be accepted before address line failure is indicated.

If all address lines have not been tested, the test then increments to the next bit in the address as the active line and the above steps are repeated. These steps are repeated until all of the address bits in the storage address have been tested for a particular card. It should be noted, that when a next card is to be tested, there will be a change in the card select bits which are at the high order at the address and each of the 20 low order address bits must be again tested as above for each card in the system.

After the first pass is completed through all address lines in the system, a second pass is then conducted in which the active address line is again set to the low order address bit and the second data pattern such as all zeros is stored into the inactive address line position address zero and the data pattern that was stored into the inactive address line position for the first pass is now stored into the active address line position such as storing all ones in address one. Again, as before, the low order address bit referred to is bit 23 as shown in FIG. 3. Also, as before, hardware error checks such as parity are active to ensure that no unrelated error masks the errors which may occur as a result of the test being conducted.

As with the first pass, the data stored in the two addresses are then read and compared bit by bit and the number of error bits are counted to determine if the predetermined number of acceptable and correctable errors has been exceeded. If such number of error bits has been exceeded, the test is ended indicating an address line failure error code.

If all address lines have not been tested for the second pass the next address bit is then made the active address bit position and the second pass is conducted for such next bit position in the address.

The steps are repeated for the second pass until all address bits in the address have been completely tested. It should be noted that the card select bits at the high end of the address must be independently exercised in that each card must be separately tested for all active address lines on that card such that the twenty lines of address will be tested independently and separately for each card selected.

It should be further noted that the card select lines at the high end of the address must be verified by separate card select test prior to the address line test which is the subject of the present invention.

It should also be noted that the number of acceptable data bit errors is dependent on the error correction capability of the storage system and the number of spare memory chips on each memory card. For example, if double bit correction is provided by a storage system, and each memory card has one spare, then the number of acceptable data errors is three.

Also, the address test of the present invention is only valid on storage systems in which each address line affects more memory chips than the number of acceptable data bit errors as discussed above.

The following examples may be helpful in understanding the operation of a testing method according to Applicants' invention.

Consider the case when an address always a "1". For this example let us use address line 23. The test begins by storing an all zeros data pattern into address 1, (line 23 on). Then an all ones data pattern is stored into address zero (address line 23 off). However, since the bit under test (bit 23 of the address) is always an "1", the all ones data pattern is actually stored in address one. When the data is read from address one, the all ones data pattern is compared to the expected data of all zeros and an address line failure is detected.

Next, consider the case where an address line is always a "0", again using address line 23, the test begins by storing an all zeros data pattern into address one (bit 23 on). However, since the bit under test is always a "0" the all zeros data pattern is actually stored into address zero. Then an all ones data pattern is stored into address zero. When the data is read from address one the all ones data pattern is compared to the expected data of all zeros and an address line failure is detected.

As shown, address lines that are always a "0" or always a "1" will always be found in the first pass of the test.

Next, consider the failure mode in which an attempt to store data in a first address also causes data to be stored at another address. Such a failure could occur from the shorting of two address lines. For this example, consider that a store to address zero will also cause a store to address one or to address two. The test begins by storing an all zeros data pattern into address one. Then an all ones pattern is stored into address zero. But due to the failure, the all ones data pattern is also stored into address one. When the data is fetched from address one, the all ones data pattern is compared to the expected data of all zeros and an address line failure is detected.

Again, consider the failure mode in which a store to a first address also causes a store to another address. In this example, consider that a store to address one will also cause a storage to address zero. The test begins by installing an all zeros data pattern into address one. But, however, due to the failure, the all zeros pattern is also stored into address zero. Then an all ones data pattern is stored into address zero. When the data is read from address one, and compared to that which is expected, the data appears to be correct. The next address line (bit 22) is then tested by storing to address two, storing to address zero fetching from both and comparing the data to that expected. This test successful as to the remainder of the address lines.

Then, the second pass of test begins by storing an all zeros data pattern into address zero. An all ones data pattern is then stored into address one. However, due to the failure, the all ones data pattern is also stored into address zero. When the data is fetched from address zero the all ones data pattern is compared to the expected data of all zeros and an address line failure is detected. This failure mode would not have been detected by a single pass test.

While the invention has been particularly shown and described with reference to a preferred embodiment thereof, it will be understood by those skilled in the art that various changes in the form and detail may be made therein without departing from the spirit and scope of the invention.

What is claimed:

1. A method for testing address line failures in a large storage array, comprising the steps of:
   first writing a first bit pattern into a first memory word at an address formed with a bit under test on;
   second writing a second bit pattern into a second memory word at an address formed with a bit under test off;
   first reading data from both of said addresses;
   first checking for a predetermined number of bit errors which constitute a permanent error;
   repeating the above steps for each bit in said address until all address lines have been tested;
   third writing said first data pattern to said second memory word at said address formed with said bit under test off;
   fourth writing said second data pattern to said first memory word at said address formed with said bit under test on;
   second reading data from both of said addresses;
   second checking for a predetermined number of bit errors which constitute a permanent error; and
   repeating the steps of third and fourth writing and second reading and checking for each bit in said address until all address lines have been tested.

2. A method for testing address line failures in a large storage array, according to claim 1:
   wherein said first bit pattern is an all zeros pattern and said second bit pattern is an all ones pattern.

3. A method for testing address line failures in a large storage array, according to claim 1:

wherein said predetermined number of bit errors which constitute a permanent error is six errors for each card in a multi-card storage array.

4. A method for testing address line failures in a large storage array, according to claim 1 further comprising the steps of:

selecting a memory card in said large storage array by setting one or more predetermined card select lines on and repeating each of the above steps for testing for address line failures separately for each card in said large storage array.

* * * * *